United States Patent
Khan et al.

(10) Patent No.: US 8,563,995 B2
(45) Date of Patent: *Oct. 22, 2013

(54) ULTRAVIOLET LIGHT EMITTING DIODE/LASER DIODE WITH NESTED SUPERLATTICE

(75) Inventors: Asif Khan, Irmo, SC (US); Qhalid Fareed, Irmo, SC (US)

(73) Assignee: Nitek, Inc., Columbia, SC (US)

( * ) Notice: Subject to any disclaimer, the term of this patent is extended or adjusted under 35 U.S.C. 154(b) by 138 days.

This patent is subject to a terminal disclaimer.

(21) Appl. No.: 12/934,651

(22) PCT Filed: Mar. 27, 2009

(86) PCT No.: PCT/US2009/038612
§ 371 (c)(1),
(2), (4) Date: Sep. 26, 2010

(87) PCT Pub. No.: WO2009/120990
PCT Pub. Date: Oct. 1, 2009

(65) Prior Publication Data
US 2011/0017976 A1    Jan. 27, 2011

Related U.S. Application Data

(60) Provisional application No. 61/070,977, filed on Mar. 27, 2008.

(51) Int. Cl.
*H01L 29/20* (2006.01)
*H01L 33/00* (2010.01)
(52) U.S. Cl.
USPC ......... 257/89; 257/103; 257/E33.001; 438/28

(58) Field of Classification Search
USPC .......... 257/12–14, 79–90, E33.001–E33.041; 438/22–47
See application file for complete search history.

(56) References Cited

U.S. PATENT DOCUMENTS 6,617,060 B2    9/2003    Weeks, Jr.
2006/0255347 A1*  11/2006    DenBaars et al. .............. 257/89

OTHER PUBLICATIONS

Patent Cooperation Treaty, Written Opinion of the International Searching Authority, Nov. 10, 2009, in re PCT/US2009/038612, Applicant Nitek, Inc. et al., Lee, Young Bae.

* cited by examiner

*Primary Examiner* — Julio J Maldonado
*Assistant Examiner* — Sonya D McCall Shepard
(74) *Attorney, Agent, or Firm* — Michael A. Mann; Nexsen Pruet, LLC

(57) ABSTRACT

A light emitting device with a template comprising a substrate and a nested superlattice. The superlattice has $Al_{1-x-y}In_yGa_xN$ wherein $0 \leq x \leq \alpha$ and $0 \leq y \leq 1$ with x increasing with distance from said substrate. An ultraviolet light-emitting structure on the template has a first layer with a first conductivity comprising $Al_{1-x-y}In_yGa_xN$ wherein $\alpha \leq x$; a light emitting quantum well region above the first layer comprising $Al_{1-x-y}In_yGa_xN$ wherein $\alpha \leq x \leq b$; and a second layer over the light emitting quantum well with a second conductivity comprising $Al_{1-x-y}In_yGa_xN$ wherein $b \leq x$. The light emitting device also has a first electrical contact in electrical connection with the first layer, a second electrical contact in electrical connection with the second layer; and the device emits ultraviolet light.

57 Claims, 2 Drawing Sheets

ULTRAVIOLET LIGHT EMITTING DIODE/LASER DIODE WITH NESTED SUPERLATTICE

CROSS-REFERENCE TO RELATED APPLICATIONS

The present invention claims priority to U.S. Provisional Patent Application No. 61/070,977 filed Mar. 27, 2008.

BACKGROUND OF THE INVENTION

The present invention relates generally to an ultraviolet light-emitting device and a method of manufacturing a light-emitting device.

Group III nitride compound semiconductors such as, for instance, gallium nitride (GaN), aluminum nitride (AlN), indium nitride (InN) (hereinafter also referred to as a "Group III-nitride semiconductor" or "III-nitrides") have been gaining attention as a material for semiconductor devices that emit green, blue or ultraviolet light. A light-emitting diode or a laser diode that emits blue light may be used for displays, for lighting and for high-density optical disk devices. A light-emitting device (which together with the acronym LED, when used herein, will for convenience also refer to both a light-emitting diode and laser diode unless otherwise specified) that emits ultraviolet radiation is expected to find applications in the field of ultraviolet curing, phototherapy, water and air purification, bio-detection, and germicidal treatment. The ultraviolet portion of the electromagnetic spectrum is often subdivided by wavelength into UVA (315-380 nm), UVB (280-315 nm) and UVC (<280 nm).

These LEDs are difficult to manufacture for a number of reasons. For example, defects arise from lattice and thermal mismatch between the group III-Nitride based semiconductor layers and a substrate such as sapphire, silicon carbide, or silicon on which they are constructed. In addition, impurities and tilt boundaries result in the formation of crystalline defects. These defects have been shown to reduce the efficiency and lifetime of LEDs and LDs fabricated from these materials. These defects have been observed for III-Nitride films grown hetero-epitaxially on the above mentioned substrates with typical dislocation densities ranging from $10^8$ $cm^{-2}$ to $10^{10}$ $cm^{-2}$ for films grown via metal-organic chemical vapor deposition (MOCVD), molecular beam epitaxy (MBE), hydride vapor phase epitaxy (HVPE) and several other less common growth techniques. Reducing the dislocation density has accordingly become an important goal.

One way to reduce the dislocation density is based on the use of epitaxial lateral overgrowth (ELOG), which is a well-known technique in the prior art. With this method, the dislocation density can be reduced to about $10^5$ $cm^{-2}$ to $10^6$ $cm^{-2}$. This method, however, has been shown to be ineffective for the growth of aluminum-containing III-Nitride based semiconductors because of the tendency for the aluminum to stick to the masked material and disrupt the lateral overgrowth. Several variations of this approach have also been demonstrated including lateral growth (PENDEO) epitaxy, and facet controlled epitaxial lateral overgrowth (FACELO). All of these techniques suffer from the same limitation as the ELOG approach for aluminum containing III-Nitride materials.

Additionally, a technique called cantilever epitaxy involves growth from pillars that are defined through etching as opposed to, for example, masking.

Currently, several research groups are actively developing low-defect density AlN substrates to improve the power-lifetime performance of the deep UV LEDs. There are reports on a new air-bridge-assisted, high-temperature (1500° C.) lateral epitaxy approach to deposit 12-µm thick, high-quality AlN layers over SiC substrates as templates for the DUV LEDs. Pulsed lateral overgrowth (PLOG) of $Al_xGa_{1-x}N$ has previously been demonstrated as an approach for depositing 15-20 µm thick $Al_xGa_{1-x}N$ over basal plane sapphire substrates. Instead of the high temperature approach, a pulsed growth mode at 1150° C. was used to enhance Al-precursor mobilities over the growth surface. These pulsed, laterally overgrown (PLOG), $Al_xGa_{1-x}N$ layers show a significantly reduced number of threading dislocations (~$10^7$ $cm^{-2}$) in the lateral-overgrowth regions, which enabled demonstration of optically-pumped lasing at 214 nm. In previous reports, the PLOG $Al_xGa_{1-x}N$ was grown either from shallow (~0.3 µm) trenched sapphire or from thin AlN etched templates (~0.3 µm).

Yet another approach to decreasing defect density is a process referred to as pulsed lateral overgrowth (PLOG) wherein preformed layers are etched to islands. By controlling the flow rate of materials a layer is coalesced over the islands.

Several other approaches to dislocation reduction have been reported that do not involve selective area growth including inserting an interlayer between the substrate and the semiconductor layer to relieve strain, filtering dislocations by bending them into each other by controlling surface facet formation or by inserting a Group III-Nitride super-lattice layer as described in Applied Physics Letters, Jul. 22, 2002; Volume 81, Issue 4, pp. 604-606, between the buffer layer and the active layer.

Accordingly, several research groups at present are developing III-nitride deep ultraviolet (DUV) light emitting diodes (LEDs) for applications in air and water purification and bio-medical systems. Milli-watt power DUV LEDs on sapphire substrates with AlGaN multiple quantum well (MQW) active regions have been previously reported for the UVA, UVB and the UVC regions. The LED design used in the prior art comprises an AlN buffer layer deposited using pulsed atomic layer epitaxy (PALE), AlN/$Al_xGa_{1-x}N$, super-lattice layer between the buffer AlN and the n-contact AlGaN layer for controlling the thin-film stress and mitigating epilayer cracking; and a p-GaN/p-AlGaN hetero-junction contact layer for improved hole injection.

A majority of the current solutions for defect mitigation involve a superlattice. The superlattice is ultimately either a sacrificial layer or it is incorporated into the finished LED with no function. A sacrificial superlattice represents material which must be manufactured and scrapped thereby increasing manufacturing and material cost. If the superlattice is included in the finished LED as n-type doping in these super-lattice is very difficult due to larger band gap. This insulating superlattice is detrimental to device performance. The thickness deviation of AlN and AlGaN leads to eventual cracking of the superlattice layer due to strain and lattice mismatch. Controlling the thickness of individual layers, quality of the epilayers and composition of AlGaN in superlattice layer is a major issue in growing high quality crack free thick AlGaN layers for high efficiency deep UVLEDs In spite of the many developments and advancements there remains significant limitation for developing high power, reliable UVLEDs. Hence there is an ongoing desire for an LED and method for forming an LED with a low defect density.

SUMMARY OF THE INVENTION

The present invention is an ultra-violet light-emitting device and method for fabricating an ultraviolet light emitting device. In a preferred embodiment, the present invention is a deep ultra-violet light-emitting structure ($\lambda_{Peak}$=190-369 nm) with a nested superlattice. The ultraviolet light-emitting structure comprises a layered arrangement of undoped or n-type $Al_{1-x-y}In_yGa_xN$ wherein 0<x≤1 and 0≤y<1, and 0<x+y≤1 layer(s), a quantum well active region and p-type $Al_{1-x-y}In_yGa_xN$ wherein 0≤x≤1, 0≤y<1 and 0≤x+y≤1 materials. The nested superlattice decreases defect propagation and helps significantly in strain management.

Other features and their advantages will be apparent to those skilled in the art of semi-conductor design and light-emitting diodes in particular from a careful reading of the foregoing Detailed Description of Preferred Embodiments, accompanied by the following drawings.

Additional features, and their advantages as would be realized, are provided in a light-emitting device. The device has a template with a substrate and a nested superlattice. The nested superlattice has $Al_{1-x-y}In_yGa_xN$ wherein 0≤x≤α and 0≤y<1 with x increasing with distance from the substrate. An ultraviolet light-emitting structure is on the template wherein the ultraviolet light-emitting structure has a first layer with a first conductivity comprising $Al_{1-x-y}In_yGa_xN$ wherein α≤x; a light emitting quantum well region above the first layer comprising $Al_{1-x-y}In_yGa_xN$ wherein α≤x≤b; and a second layer over the light emitting quantum well with a second conductivity comprising $Al_{1-x-y}In_yGa_xN$ wherein b≤x. The light emitting device also has a first electrical contact in electrical connection with the first layer, a second electrical contact in electrical connection with the second layer; and α, b and y are selected such that when an electrical potential is applied to the first electrical contact and the second electrical contact the device emits ultraviolet light.

Yet another advantage is provided in a light-emitting device. The device has a template with a substrate and a nested superlattice on the substrate. The nested superlattice comprises $Al_{1-x-y}In_yGa_xN$ wherein 0≤x≤0.77 and 0≤y<1 with x increasing with distance from the substrate. An ultraviolet light-emitting structure is on the template wherein the ultraviolet light-emitting structure has a first layer with a first conductivity comprising $Al_{1-a-b}In_bGa_aN$ wherein x≤a; a light emitting quantum well region above the first layer comprising $Al_{1-c-d}In_dGa_cN$ wherein a≤c≤0.77; and a second layer over the light emitting quantum well with a second conductivity comprising $Al_{1-e-f}In_fGa_eN$ wherein c≤e≤1 and e increases with distance from the substrate. The light emitting device also has a first electrical contact in electrical connection with the first layer. A second electrical contact in electrical connection with the second layer; and when an electrical potential is applied to the first electrical contact and the second electrical contact the device emits ultraviolet light.

Yet another embodiment is provided in a method of making a light-emitting device, comprising the steps of:
forming a template by:
applying at least one nested superlattice to a substrate, wherein the nested superlattice comprises a layer of AlN and a layer of $Al_{1-x-y}In_yGa_xN$, wherein 0<x≤1, 0≤y<1 and 0<x+y≤1, and x increases with distance from said AlN; and
placing an ultraviolet light-emitting structure on the template wherein the ultraviolet light-emitting structure has a first layer with a first conductivity and a second layer with a second conductivity; and
connecting electrically a first electrical contact with the first layer of the ultraviolet light-emitting structure and a second electrical contact with the second layer of the ultraviolet light-emitting structure.

DETAILED DESCRIPTION OF PREFERRED EMBODIMENTS

The present invention is directed to a light-emitting device (LED) and a method for making an LED, particularly, one that emits deep ultraviolet light. In particular, it is directed to an improved template with a nested superlattice wherein strain and propagation of dislocations is mitigated by the nested superlattice. The template serves as a platform for the ultraviolet light-emitting structure.

The invention will be described with reference to the various figures forming an integral part of the instant disclosure. The figures, and descriptions thereof, refer specifically to preferred embodiments without limit thereto. Throughout the figures similar elements will be numbered accordingly.

Figure 1:
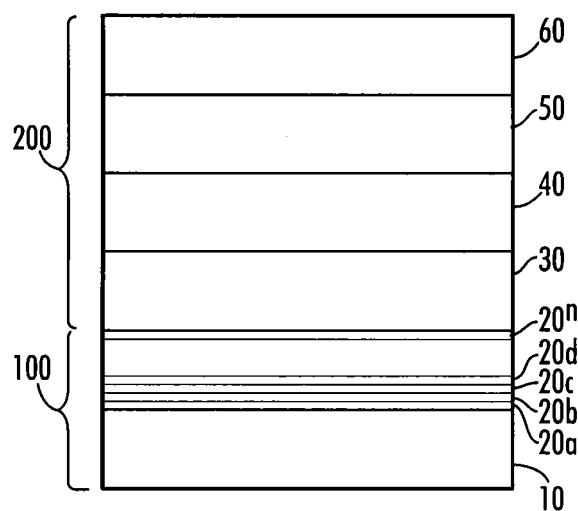
FIG. 1 is a schematic cross-sectional view of an embodiment of the present invention.

An embodiment of the invention will be described with reference to FIG. 1 wherein a schematic cross-sectional view is provided. In FIG. 1, a template, 100, includes a substrate, 10, upon which subsequent layers are grown.

The nested superlattice forms a transitional composition between the first layer coated on the substrate and the n-contact layer described further herein. Each layer has a composition of $Al_{1-x-y}In_yGa_xN$ wherein 0≤x≤α, 0≤y≤1 and 0<x+y≤1, where α is the Ga concentration in the quantum well. The Ga/Al ratio increases with distance from the substrate. The In level may be constant throughout the number of layers or it may be altered as discussed further herein.

The substrate, 10, is preferably sapphire. Although preferably made of sapphire, the substrate may be made of silicon carbide, GaN, AlN, AlGaN, InN, InGaN, AlInGaN, Silicon, GaAs, $LiAlO_3$, $LiGaO_3$, ZnO, or a metal. The substrate preferably has a crystallographic orientation along the C-plane, A-plane, M-plane or R-plane and has a mis-orientation ranging from 0.0° to 10° from its axis.

The initial layer of the nested superlattice is preferably Al and AlN or an AlN and AlGaN or Al and AlGaN. The composition of the nested superlattice varies from that of AlGaN, to the composition of the n-contact layer, 30 by systematic increases in Ga. With reference to FIG. 1, the nested superlattice layer, 20, may comprise a continuous gradient with an increasing Ga/Al ratio initiating at zero and terminating at the Ga/Al ratio of the n-contact layer which is selected based on the desired emission of the LED. For example, if the desired wavelength of emission is 272 nm the n-contact layer, quantum well and p-contact layer will have a nominal composition of about $Al_{0.5}Ga_{0.5}N$, with any presence of In replacing the Al and Ga in suitable lattice match quantities or replacing Al with Ga. The superlattice will therefore have a continuous composition from AlN to $Al_{0.5}Ga_{0.5}N$.

In an alternative embodiment the nested superlattice may comprise sublayers, $20^1$-$20^n$. The sublayers represent step changes in composition. Each subsequent sublayer represents an increased Ga/Al ratio relative to the previous layer. Within each sublayer the Ga/Al ratio may remain constant or it may increase with distance from the substrate. By way of example, a specific sublayer may have a constant composition such as $Al_{1-x}Ga_xN$ with x=0.1. The subsequent sublayer may then have a constant composition such as $Al_{1-x}Ga_xN$ with x=0.15 with continuing layers applied having sequentially increased Ga levels until the desired composition is reached thereby forming stepped concentrations. The Ga concentration changes between successive layers may be constant or varied with distance from the substrate. In another embodiment, each layer may have an initial composition with increasing concentration of Ga through the sublayer thereby forming graded steps. For example, a specific sublayer may have an initial composition such as $Al_{1-x}Ga_xN$ with $x=0.1$ and a final composition of $Al_{1-x}Ga_xN$ with $x=0.125$ with a continuous composition gradient there between. The subsequent sublayer may then have an initial composition of $Al_{1-x}Ga_xN$ with $x=0.15$ and a final composition of $Al_{1-x}Ga_xN$ with $x=0.175$. In each case, the superlattice has a composition gradient which mimics a continuous gradient.

An ultraviolet light-emitting structure, 200, is applied to the template, 100. In general, the ultraviolet light-emitting structure comprises a pair of semiconductor layers of opposing polarity separated by a quantum well layer. Each layer will be described further herein. The order of the semiconductor layers is not particularly limited with the proviso that eventual biasing is applied correctly. For the purposes of discussion the n-type semiconductor will be described as being deposited initially with the understanding that the reverse could be done in an analogous fashion.

The first semiconductor layer, 30, which is preferably doped with an n-type dopant, is applied to the template. Though illustrated as a single layer the first semiconductor layer may be multiple layers wherein each layer has an elemental composition differing, or the same as, one or more adjacent layers.

A quantum well region, 40, is applied to the first semiconductor layer, 30. The quantum well, though illustrated as a single layer, preferably comprises several barrier and well layers forming a quantum-well region. It is most preferred that the quantum well have an emission spectrum ranging from 190 nm to 369 nm. The quantum well preferably comprises $Al_{1-x-y}In_yGa_xN$ wherein $0<x<1$, $0\leq y\leq 1$, and $0<x+y\leq 1$. The quantum well preferably has a surface and a band gap.

The quantum well region preferably begins and terminates with a barrier layer. The barrier layer preferably includes $Al_{1-x-y}In_yGa_xN$ wherein $0<x\leq 1$, $0\leq y<1$ and $0<x+y\leq 1$ and the quantum well and barrier layer have different compositions. The quantum well region preferably comprises a single quantum well and multiple quantum layers. In one embodiment, the quantum well is preferably doped with at least one n-type dopant with the most preferred dopants selected from the group consisting of silicon, indium and carbon. In another embodiment the quantum well is doped with at least one p-type dopant preferably selected from the group consisting of magnesium, zinc and beryllium. In another embodiment the quantum well is doped with at least one n-type and at least one p-type dopant. It is particularly preferred that the quantum well region produces ultra-violet photons. In a preferred embodiment the quantum well region emits with a wavelength λ in the range 190 nm≤λ≤240 nm. In another preferred embodiment the quantum well region emits with a wavelength λ in the range 240 nm≤λ≤280 nm. In another preferred embodiment the quantum well region emits with a wavelength λ in the range 280 nm≤λ≤320 nm. In another preferred embodiment the quantum well emits with a wavelength λ in the range 320 nm≤λ≤369 nm.

A second semiconductor layer, 60, having a second type of conductivity than the first semiconductor layer is applied on the quantum well. The second semiconductor layer comprises $Al_{1-x-y}In_yGa_xN$ with x at least as high for the quantum well and preferably increasing with distance from the substrate until the aluminum is no longer present.

Two metal contacts are ultimately applied to this construction, one to the semiconductor layer having the first type of conductivity and the other to the semiconductor layer having the second type of conductivity, to complete the LED. Each of these layers, and formation of contacts thereto will be described in detail below.

In an alternative embodiment the nested superlattice may be deposited by metalorganic chemical vapor deposition, hydride vapor phase epitaxy, molecular beam epitaxy, metalorganic hydride vapor phase epitaxy, pulse atomic layer epitaxy and similar methods.

In one method of depositing the nested superlattice, an Group III nitride precursor flows for 0 to 30 secs followed by an ammonia and Group III precursors flowing for 0-240 secs. For example, an AlN is deposited with an Al flow followed by Al and ammonia flow. The first sublayer of AlInN is followed by Al and indium precursor flow followed by Al, indium and ammonia flow. This leads to formation of second sublayer of AlInN. Then the third step is deposition of third AlGaN sub layer by flowing Al and Ga in the first step and Al, Ga and ammonia in the next step. The first superlattice is formed repeating the AlInN and AlGaN for one time or multiple times. A nested superlattice is formed by depositing a first AlN sub layer following the first superlattice of AlInN and AlGaN. The composition of Al and Indium in AlInN and Al and Ga in AlGaN are constantly changed up to the n-contact layer. The composition is adjusted such that the the thick nested superlattice layer is transparent to the wavelength of light emitted by the multiple quantum well.

In a second method depositing nested superlattice, ammonia flows for 0 to 30 secs follow by ammonia and Group III precursors flowing for 0-240 secs. For example, an AlN is deposited with an ammonia flow followed by Al and ammonia flow. The first sublayer of AlInN is followed by ammonia precursor flow followed by an Al, indium and ammonia flow. This leads to formation of a second sublayer of AlInN. Then the third step is deposition of a third AlGaN sub layer by flowing ammonia in the first step and Al, Ga and ammonia in the next step. The first superlattice is formed repeating the AlInN and AlGaN for one time or multiple times. A nested superlattice is formed by depositing a first AlN sub layer following the first superlattice of AlInN and AlGaN. The composition of Al and In in AlInN and Al and Ga in AlGaN are constantly changed up to the n-contact layer. The composition is adjusted such that the thick nested superlattice layer is transparent to the light emitted by the multiple quantum well.

In another method of forming nested superlattice a Group III nitride precursor flows for 0 to 60 secs followed by an ammonia and Group III precursors flowing for 0-240 secs. For example, AlN is deposited with an Al flow followed by Al and ammonia flow. The first sublayer of AlInN is followed by Al and indium precursor followed by Al, Ga and ammonia flow. This leads to formation of a second sublayer of $Al_mGa_nN$. Then the third step is deposition of a third $Al_pGa_qN$ sub layer by flowing Al and Ga in the first step and Al, Ga and ammonia in the next step. The first superlattice is formed repeating the $Al_mGa_nN$ and $Al_pGa_qN$ for one time or multiple times. A nested superlattice is formed by depositing a first AlN sub layer following the first superlattice of $Al_mGa_nN$ and $Al_pN$. The composition of Al and Ga in $Al_mGa_nN$ and Al and Ga in $Al_pGa_qN$ is constantly changed up to the n-contact layer. The composition is adjusted such that the thick nested superlattice layer is transparent to light emitted by the multiple quantum well.

In another method of forming a nested superlattice a Group III nitride precursor flows for 0 to 60 secs followed by ammonia and Group III precursors flowing for 0-240 secs. For example, an $Al_aIn_bGa_{1-a-b}N$ is deposited with an Al, Ga and In flow followed by Al, Ga, In and ammonia flow. The first sublayer of AlInGaN is followed by Al, Ga, indium precursor flow followed by Al, Ga, indium and ammonia flow or vice versa. This leads to formation of a second sublayer of $Al_xIn_yGa_{1-x-y}N$. Then the third step is deposition of a third $Al_cIn_dGa_{1-c-d}N$ sub layer by flowing Al, Ga, in the first step and Al, Ga, In and ammonia in the next step. The first superlattice is formed repeating the $Al_xIn_yGa_{1-x-y}N$ and $Al_cIn_dGa_{1-c-d}N$ for one time or multiple times. A nested superlattice is formed by depositing a first $Al_aIn_bGa_{1-a-b}N$ sub layer following the first superlattice of $Al_xIn_yGa_{1-x-y}N$ and $Al_cIn_dGa_{1-c-d}N$. The composition of Al, Ga and In are different in all the layers and are constantly changed up to the n-contact layer. The composition is adjusted such that the thick nested superlattice layer is transparent to light emitted by the multiple quantum well.

Each layer, other than the substrate, is made of a Group III-nitride, preferably $Al_{1-x-y}In_yGa_xN$ wherein $0<x\leq 1$, $0\leq y<1$ and $0<x+y\leq 1$. The precursor sources include a metal-organic source, ammonia, a carrier gas and, optionally, doping sources such as silane, and/or biscyclopentadienyl magnesium. The metal-organic source is preferably trimethyl aluminum, trimethyl gallium, triethyl gallium or trimethyl indium. The preferred carrier gas is hydrogen and/or nitrogen.

Figure 2:
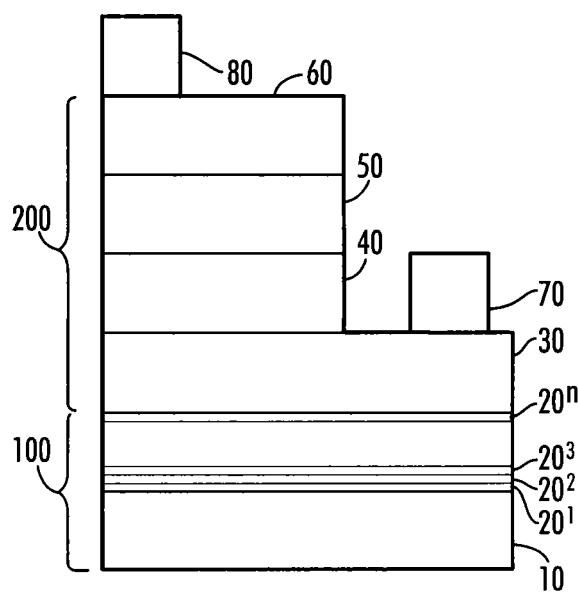
FIG. 2 is a schematic cross-sectional view of an embodiment of the present invention.

FIG. 2 illustrates template 10 with a layered, UV-emitting structure, 200, thereon, plus metal contacts 70 and 80. Except for metal contacts, 70 and 80, and the substrate, 10, all layers are preferably made of III-Nitride material.

With further reference to FIG. 2, the LED structure is grown beginning with a III-Nitride first semiconductor layer, 30, with a first type of conductivity, applied directly on the template, 100, comprising the nested superlattice, 20. It is preferred that the first semiconductor layer be an layer made of $Al_{1-x-y}In_yGa_xN$ wherein $0<x\leq 1$, $0\leq y<1$ and $0<x+y\leq 1$ formed such that the layer is transparent to the light to be emitted from the quantum well active region. Another III-Nitride layer is then formed as a quantum well region, 40, which includes one or more barrier and one or more well sub-layers, each having different compositions such that the band-gap of the barrier layer is larger than that of the well layer. The thickness of the barrier and well layers should be between 1-200 Å. The well sub-layer has a specific band-gap and is designed to provide a region with good quantum confinement, wherein electrons and holes readily combine, preferably with radiative and non-radiative recombination but with radiative recombination dominating the non-radiative recombination. The quantum well sub-layer emits light in the range of 190 nm to 369 nm. Layer, 30, is preferably given the first type of conductivity using silicon, or is co-doped using a combination of silicon, oxygen, and/or indium.

A p-type AlInGaN hole tunneling layer, 50, is incorporated directly above the active region layer, 40, such that the band-gap of, 50, is larger than the bandgap of any barrier sublayer. Magnesium is preferably used as the p-type dopant. Additional p-type AlInGaN layers may be formed such that the band-gap of the layers decreases for each subsequent layer. Subsequent layers may be one single AlInGaN layer, or may comprise a compositionally graded layer, a series of decreasing composition superlattices, or several distinct layers with decreasing bandgap to afford adequate adherence to the contact.

A p-type hole supplying AlInGaN layer, 60 is incorporated directly above the hole tunneling layer 50. Magnesium is preferably used as the p-type dopant. Additional p-type AlInGaN layers may be formed such that the band-gap of the layers decreases for each subsequent layer. In addition to magnesium, the layer can be co-doped with indium, zinc, beryllium etc. Subsequent layers may be one single AlInGaN layer, or may comprise a compositionally graded layer, a series of decreasing composition superlattices, or several distinct layers with decreasing bandgap to afford adequate adherence to the contact. In one embodiment the Ga level may decrease from the composition of the quantum well to a GaN layer with no aluminum. The composition change may be continuous, stepped or graded steps as described above.

A mesa-type LED may then be fabricated, the type shown in FIG. 2, using reactive ion etching (RIE) to access the bottom n+ layer, 30. Finally, probe metal conducting pads, 70 and 80, are deposited on both the n+ and p+ layers, respectively. Ti/Al/Ti/Au and Ni/Au are used as metal contacts for the n− and p− contacts, respectively, however, the n-metal contacts can be made of Ti, Al, Ni, Au, Mo, Ta or any combination of these metals. The second contact, the p+ layer contact, can be made of Pd, Ni, Ag, Au, indium tin oxide (ITO), NiO, PdO or any combination of the above-mentioned metals. These contacts could be annealed in air, a forming gas, nitrogen or any combination of such. As would be apparent the layer arrangement can be reversed without consequence.

In an alternative configuration, after construction the template may be removed by polishing, etching or lifting-off using a laser. Metallic contacts can be applied to the device such that one is in electrical contact with layer 30 and one is in electrical contact with layer, 60.

Figure 3A:
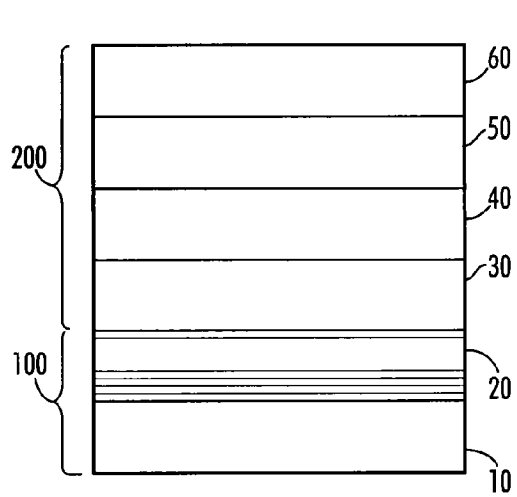
FIGS. 3A-C are schematic cross-sectional views of an embodiment of the present invention.
Figure 3B:
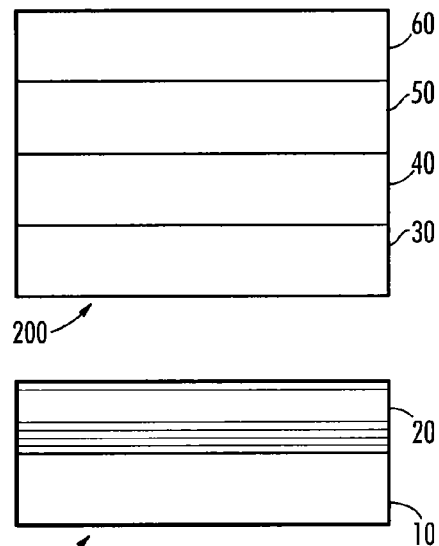
Figure 3C:
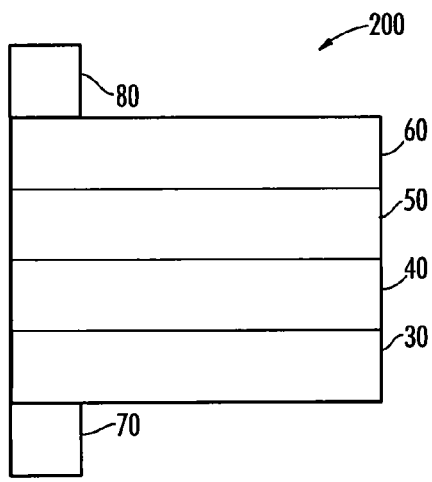

An embodiment of the invention will be described with reference to FIG. 3 wherein a schematic cross-sectional representation of an embodiment is illustrated. In FIG. 3A the template, 100, comprising a substrate, 10, and nested superlattice, 20, are as described previously. Similarly, the UV-emitting structure, 200, comprising semiconductor layers, 30 and 60, and quantum layer, 40, and barrier layer, 50, are as described above. In FIG. 3B the template, 100, is separated from the UV-emitting structure, 200. By removing the template the terminations, 70 and 80, can be placed directly on the semiconductor layers as illustrated in FIG. 3C.

The hole tunneling, or barrier, layer has a preferred thickness of 1 to 1000 Angstroms and a band gap of from 0.15 eV to 2.62 eV higher than the quantum well barrier layer band gap.

It is an ongoing desire to reduce resistance in a layer, and particularly, at the interface between layers. Resistance at the contact layers is a particular concern since this resistance is a source of heat. As current is increased the heat increases. This limits the current at which an LED can be operated. With silicone doping this is a particular problem. The incorporation of indium in a layer has been surprisingly found to significantly reduce the resistance of a layer. Indium is particularly desirable in doped layers such as silicon doped or magnesium doped layers. At a given level of silicon doping, for example, incorporation of indium reduces the resistance thereby decreasing the heat generation which allows for an increase in the current at which the LED can be operated. In a silicon doped layer the indium is preferable present in an amount ranging from $10^{15}$ to $10^{24}$ atoms/cm$^3$. In a magnesium doped layer the indium is preferably present in an amount ranging from $10^{15}$ to $10^{24}$ atoms/cm$^3$.

It will be apparent to those skilled in the art of ultraviolet light-emitting diodes and laser diodes that many modifications and substitutions can be made to the preferred embodi-

What is claimed is:

1. A light-emitting device comprising:
    a template comprising:
        a substrate; and
        a nested superlattice on said substrate wherein said nested superlattice comprises $Al_{1-x-y}In_yGa_xN$ wherein $0 \leq x \leq \alpha$ and $0 \leq y \leq 1$ with x increasing with distance from said substrate;
    an ultraviolet light-emitting structure on said template wherein said ultraviolet light-emitting structure comprises:
        a first layer with a first conductivity comprising $Al_{1-x-y}In_yGa_xN$ wherein $\alpha \leq x$;
        a light emitting quantum well region above said first layer comprising $Al_{1-x-y}In_yGa_xN$ wherein $\alpha \leq x \leq b$; and
        a second layer over said light emitting quantum well with a second conductivity comprising $Al_{1-x-y}In_yGa_xN$ and
    a first electrical contact in electrical connection with said first layer;
    a second electrical contact in electrical connection with said second layer; and
    whereby said $\alpha$, b and y are selected such that when an electrical potential is applied to said first electrical contact and said second electrical contact said device emits ultraviolet light.

2. The light emitting device of claim 1 wherein said nested superlattice comprises sublayers.

3. The light-emitting device of claim 2 wherein said x increases with distance from said substrate within each sublayer of said sublayers.

4. The light-emitting device of claim 3 wherein each sublayer has an initial value of x which is higher than a previous sublayer.

5. The light emitting device of claim 2 wherein within each sublayer of said sublayers, said x is constant.

6. The light emitting device of claim 5 wherein each sublayer has a value of x which is higher than a previous sublayer.

7. The light-emitting device of claim 1 wherein $\alpha = b$.

8. The light emitting device of claim 1, wherein said quantum well region comprises alternating layers of:
    a quantum well comprising $Al_{1-x-y}In_yGa_xN$ wherein $0 \leq x \leq 1$, $0 \leq y \leq 1$, and $0 \leq x+y \leq 1$, said quantum well having a surface and a band gap; and
    a barrier layer on said surface of said quantum well, said barrier layer having a band gap larger than said band gap of said quantum well, and wherein said barrier layer includes $Al_{1-x-y}In_yGa_xN$ wherein $0<x<1$, $0 \leq y<1$ and $0<x+y \leq 1$, and wherein said quantum well region begins and terminates with said barrier layer.

9. The light emitting device of claim 8 wherein said quantum well region comprises a single quantum well and multiple quantum layers.

10. The light emitting device of claim 8, wherein said quantum well and said barrier layer have different compositions.

11. The light emitting device of claim 8, wherein said quantum well is doped with at least one n-type dopant selected from the group consisting of silicon, oxygen, indium and carbon.

12. The light emitting device as recited in claim 8, wherein said quantum well is doped with at least one p-type dopant selected from the group consisting of magnesium, zinc and beryllium.

13. The light emitting device of claim 8, wherein said quantum well is doped with at least one n-type and at least one p-type dopant.

14. The light emitting device of claim 8, wherein said quantum well region produces ultra-violet photons.

15. The light emitting device of claim 8, wherein said quantum well region emits with a wavelength $\lambda$ in the range 190 nm $\leq \lambda \leq$ 240 nm wherein said $\alpha \leq 0.3$.

16. The light emitting device of claim 8, wherein said quantum well region emits with a wavelength $\lambda$ in the range 240 nm $\leq \lambda \leq$ 280 nm wherein said $\alpha \leq 0.55$.

17. The light emitting device of claim 8 wherein said quantum well region emits with a wavelength $\lambda$ in the range 280 nm $\leq \lambda \leq$ 320 nm wherein said $\alpha \leq 0.78$.

18. The light emitting device of claim 8 wherein said quantum well region emits with a wavelength $\lambda$ in the range 320 nm $\leq \lambda \leq$ 369 nm wherein said $\alpha \geq 0.77$.

19. The light emitting device of claim 1 comprising of nitride semiconductor layers and plurality of nitride semiconductor layers is doped with indium at less than $10^{24}$ atoms per cubic cm.

20. A light-emitting device comprising:
    a template comprising:
        a substrate; and
        a nested superlattice on said substrate wherein said nested superlattice comprises $Al_{1-x-y}In_yGa_xN$ wherein $0 \leq x \leq 0.77$ and $0 \leq y < 1$ with x increasing with distance from said substrate;
    an ultraviolet light-emitting structure on said template wherein said ultraviolet light-emitting structure comprises:
        a first layer with a first conductivity comprising $Al_{1-\alpha-b}In_bGa_aN$ wherein $x \leq \alpha$;
        a light emitting quantum well region above said first layer comprising $Al_{1-c-d}In_dGa_cN$ wherein $\alpha \leq c \leq 0.77$; and
        a second layer over said light emitting quantum well with a second conductivity comprising $Al_{1-e-f}In_fGa_eN$ wherein $c \leq e \leq 1$ and e increases with distance from said substrate ; and
    a first electrical contact in electrical connection with said first layer;
    a second electrical contact in electrical connection with said second layer; and
    whereby when an electrical potential is applied to said first electrical contact and said second electrical contact said device emits ultraviolet light.

21. The light-emitting device of claim 20 wherein said first electrical contact is carried on said first layer with a first conductivity.

22. The light-emitting device of claim 20 wherein said substrate has crystallographic orientation along c-plane, A plane, M plane or R plane.

23. The light-emitting device of in claim 22 wherein said substrate has a mis-orientation of less than 10° from its axis.

24. The light-emitting device of claim 20, wherein at least one of said first electrical contact and said second electrical contact is made of Ti, Al, Ni, Au, ITO, Mo, Ta or a combination of any of these metals as a single layer or multistack layer.

25. The light emitting device of claim 20 wherein said nested superlattice comprises sublayers.

26. The light-emitting device of claim 25 wherein said x increases with distance from said substrate within each sublayer of said sublayers.

27. The light-emitting device of claim 26 wherein each sublayer has an initial value of x which is higher than a previous sublayer.

28. The light emitting device of claim 25 wherein within each sublayer of said sublayers said x is constant.

29. The light-emitting device of claim 28 wherein each sublayer has a value of x which is higher than a previous sublayer.

30. The light emitting device of claim 20 wherein said quantum well region comprises a single quantum well and multiple quantum layers.

31. The light emitting device of claim 20 wherein said quantum well and said barrier layer have different compositions.

32. The light emitting device of claim 20 wherein said quantum well is doped with at least one n-type dopant selected from the group consisting of silicon, indium and carbon.

33. The light emitting device of claim 20 wherein said quantum well is doped with at least one p-type dopant selected from the group consisting of magnesium, zinc and beryllium.

34. The light emitting device of claim 20 wherein said quantum well is doped with at least one n-type and at least one p-type dopant.

35. The light emitting device of claim 20 wherein said quantum well region produces ultra-violet photons.

36. The light emitting device of claim 20 wherein said quantum well region emits with a wavelength $\lambda$ in the range 190 nm$\leq\lambda\leq$240 nm wherein said c$\leq$0.3.

37. The light emitting device of claim 20, wherein said quantum well region emits with a wavelength $\lambda$ in the range 240 nm$\leq\lambda\leq$280 nm wherein said c$\leq$0.55.

38. The light emitting device of claim 20 wherein said quantum well region emits with a wavelength $\lambda$ in the range 280 nm$\leq\lambda\leq$320 nm wherein said c$\leq$0.77.

39. The light emitting device of claim 20 wherein said quantum well region emits with a wavelength $\lambda$ in the range 320 nm$\leq\lambda\leq$369 nm.

40. A method of making a light-emitting device, comprising the steps of:
   forming a template by:
      applying at least one nested superlattice to a substrate, wherein said nested superlattice comprises a layer of AlN and a layer of $Al_{1-x-y}In_yGa_xN$, wherein 0<x$\leq$1, 0$\leq$y<1 and 0<x+y$\leq$1, and x increases with distance from said AlN; and
   placing an ultraviolet light-emitting structure on said template wherein said ultraviolet light-emitting structure has a first layer with a first conductivity and a second layer with a second conductivity; and
   connecting electrically a first electrical contact with said first layer of said ultraviolet light-emitting structure and a second electrical contact with said second layer of said ultraviolet light-emitting structure.

41. The method of making a light-emitting device of claim 40 wherein said nested superlattice comprises sublayers.

42. The method of making a light-emitting device of claim 41 wherein said x increases with distance from said substrate within each sublayer of said sublayers.

43. The method of making a light-emitting device of claim 42 wherein each sublayer has an initial value of x which is higher than a previous sublayer.

44. The method of making a light-emitting device of claim 41 wherein within each sublayer of said sublayers said x is constant.

45. The method of making a light-emitting device of claim 44 wherein each sublayer has a value of x which is higher than a previous sublayer.

46. The method of making a light-emitting device of claim 40, wherein said quantum well region comprising alternating layers of:
   a quantum well comprising $Al_{1-x-y}In_yGa_xN$ wherein 0$\leq$x$\leq$1, 0<y<1, and 0<x+y$\leq$1, said quantum well having a surface and a band gap; and
   a barrier layer on said surface of said quantum well, said barrier layer having a band gap larger than said band gap of said quantum well, and wherein said barrier layer includes $Al_{1-x-y}In_yGa_xN$ wherein 0<x<1, 0$\leq$y<1 and 0<x+y$\leq$1, and wherein said quantum well region begins and terminates with said barrier layer.

47. The method of making a light-emitting device of claim 46 wherein said quantum well region comprises a single quantum well and multiple quantum layers.

48. The method of making a light-emitting device of claim 46, wherein said quantum well and said barrier layer have different compositions.

49. The method of making a light-emitting device of claim 46, wherein said quantum well is doped with at least one n-type dopant selected from the group consisting of silicon, indium and carbon.

50. The method of making a light-emitting device of claim 46, wherein said quantum well is doped with at least one p-type dopant selected from the group consisting of magnesium, zinc and beryllium.

51. The method of making a light-emitting device of claim 46, wherein said quantum well is doped with at least one n-type and at least one p-type dopant.

52. The method of making a light-emitting device of claim 46, wherein said quantum well region produces ultra-violet photons.

53. The method of making a light-emitting device of claim 46, wherein said quantum well region emits with a wavelength $\lambda$ in the range 190 nm$\leq\lambda\leq$240 nm wherein said x$\leq$0.3.

54. The method of making a light-emitting device of claim 46, wherein said quantum well region emits with a wavelength $\lambda$ in the range 240 nm$\leq\lambda\leq$280 nm wherein said x$\leq$0.55.

55. The method of making a light-emitting device of claim 46 wherein said quantum well region emits with a wavelength $\lambda$ in the range 280 nm$\leq\lambda\leq$320 nm wherein said x$\leq$0.78.

56. The method of making a light-emitting device of claim 46 wherein said quantum well region emits with a wavelength $\lambda$ in the range 320 nm$\leq\lambda\leq$369 nm wherein said x$\geq$0.77.

57. The method making a light emitting device of claim 46 wherein said light emitting device is a light emitting diode, laser diode or a photodetector.

* * * * *